United States Patent [19]
Gabillard

[11] Patent Number: 6,020,763
[45] Date of Patent: Feb. 1, 2000

[54] HIGH SPEED DECODER WITHOUT RACE CONDITION

[75] Inventor: Betrand Gabillard, Paris, France

[73] Assignee: International Business Machines Corporation, Armonk, N.Y.

[21] Appl. No.: 08/771,124

[22] Filed: Dec. 20, 1996

[30] Foreign Application Priority Data

Apr. 23, 1996 [EP] European Pat. Off. .............. 96480048

[51] Int. Cl.[7] ................................................. H03K 19/084
[52] U.S. Cl. ........................................... 326/108; 326/121
[58] Field of Search ................................. 326/93, 95, 98, 326/105, 106, 108, 112, 121; 325/230.06

[56] References Cited

U.S. PATENT DOCUMENTS

| | | | |
|---|---|---|---|
| 4,748,597 | 5/1988 | Saito et al. ............................. | 326/105 |
| 4,916,334 | 4/1990 | Minagawa .......................... | 365/230.06 |
| 4,958,319 | 9/1990 | Von Basse et al. ................. | 365/230.06 |
| 5,018,108 | 5/1991 | Maruyama .......................... | 365/230.06 |
| 5,311,479 | 5/1994 | Harada ................................ | 326/106 |
| 5,327,026 | 7/1994 | Hardee et al. ..................... | 326/106 |
| 5,432,744 | 7/1995 | Nagata ............................... | 365/230.06 |
| 5,469,391 | 11/1995 | Haraguchi ......................... | 365/230.06 |

*Primary Examiner*—Jon Santamauro
*Assistant Examiner*—Don Phu Le
*Attorney, Agent, or Firm*—Robert A. Walsh

[57] ABSTRACT

A self-clocked apparatus for eliminating race condition in high speed decoders is provided. In multi-stage decoders, a first stage is generally composed of predecoder blocks while a second stage is generally composed of decoder/driver blocks. Each predecoder block receives several address bits and outputs a high or low level signal depending on the address bit's state. Each decoder/driver block receives the output signal of the corresponding predecoder block, and outputs a signal selecting or not selecting a connected line. The self-clocked apparatus of the invention is cross-connected between adjacent predecoder blocks such that the ith decoder/driver block is controlled by the i+1th predecoder block, and conversely. No external clock signal is used, and no time margins are required. Furthermore, the invention provides a robust electrical design.

6 Claims, 7 Drawing Sheets

HIGH SPEED DECODER WITHOUT RACE CONDITION

TECHNICAL FIELD

The present invention related to high speed memory chips, and more particularly to high speed decoder improved with a self-clocked circuit avoiding race conditions.

BACKGROUND ART

In high speed VLSI systems, wiring is an important parameter as it may generate unuseful internal delays which directly impact the global performance of the system. Due to chip design constraints, the signals propagate on different paths and race conditions are often occurring, leading to overlapped operations. The worst case delays are often taken as reference delays for synchronization of signals, and generally a clock or a control signal based on this reference delay is gating the circuits to be selected. Moreover, a time margin is most often added to the worst case reference delay to be sure that all switching of signals are ended before the gating signal becomes active.

The general state of the prior art with respect to solving the race conditions problem may be best illustrated and understood with reference to several patents described now.

U.S. Pat. No. 5,121,005 discloses a programmable logic array (PLA) wherein the propagation paths for the control signals are made slower than the worst case data path to eliminate race conditions. The PLA operates with a single clock signal frequency which delays the control signals allowing time for the signals to reach steady state.

U.S. Pat. No. 5,124,572 discloses a clocking methodology using global overlapping clocks for providing timing advantages and locally non-overlapping clocks derivative from the overlapping clocks for eliminating race conditions.

In U.S. Pat. No. 4,544,850, a mediator circuit is used to prevent gate delay variations from causing processing to commence after a period of time during which data is made available. The mediator circuit outputs a gated data signal provided by a data enable signal and a data signal.

In the decoders, and particularly in high speed decoders the aforementioned problem is crucial as only one line (a wordline or a pair of bitlines) has to be selected among all, otherwise a wrong data is read from or written into the memory array.

Usually, with a large number of address inputs, the decoder is split in several stages referred to as predecoder, decoder, driver, wherein the address paths are different for each stage. As a result, mistracking along these different address paths could occur, so time margins are absolutely required in order to avoid race conditions. Unfortunately these time margins are directly added to the access time, and thus decrease the overall system speed performance.

In the known multi-stage decoders, the time margin is usually added to the delay of the decoder/driver stage. A clock signal applied to the input of this stage becomes active when all predecoding signals have reached a steady state, allowing only one line to be selected.

Figure 1A:
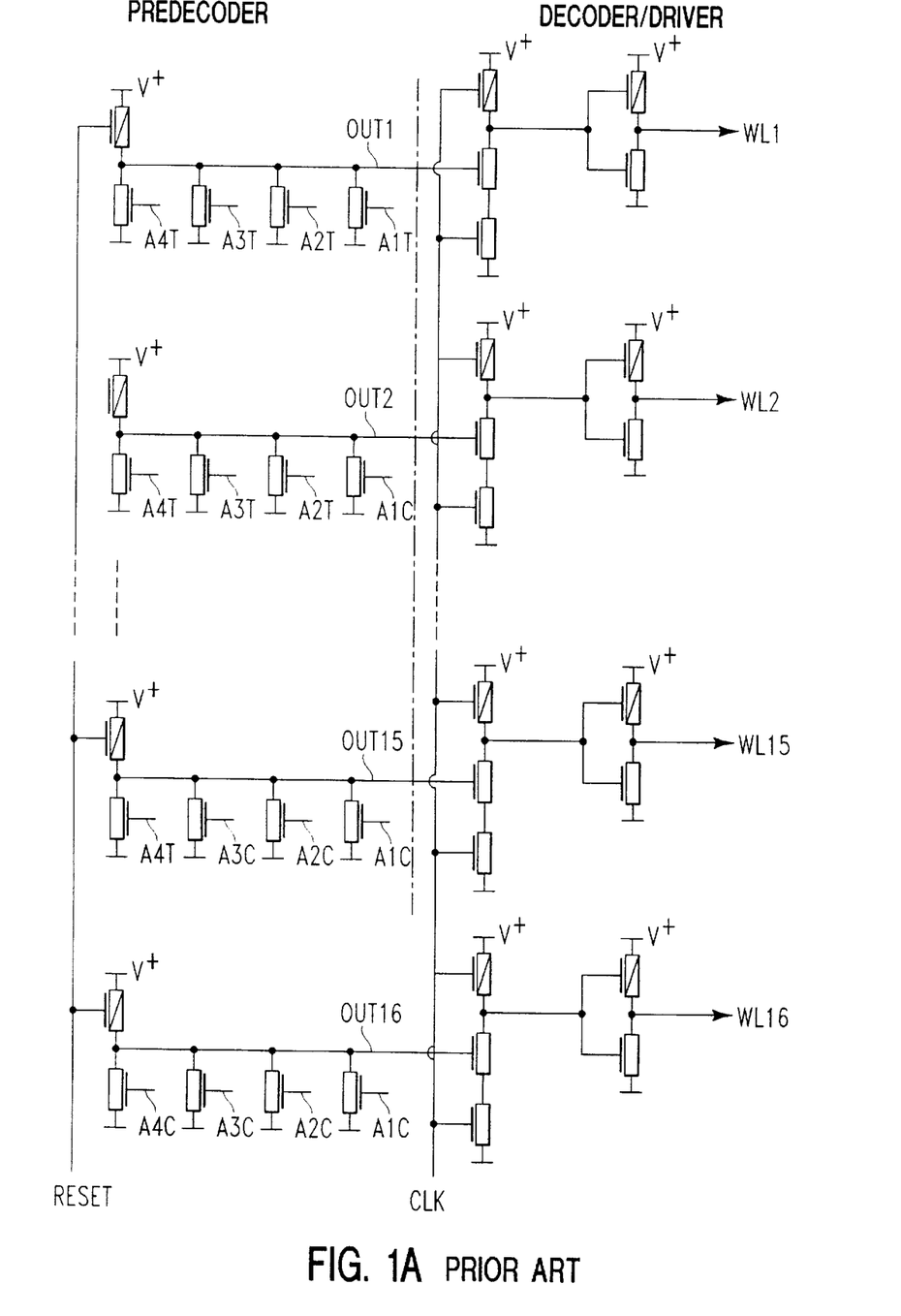
FIG. 1A shows a typical multi-stage word decoder with address paths wired according to a 4-bit binary code.

Referring to FIG. 1A, a two-stage word decoder of the prior art particularly adapted for use in high speed memories, is illustrated. The specific details of operation of this system, which are well understood by those skilled in the art, will be omitted from this discussion. The devices of the predecoder stage are connected according to the so-called NOR-type logic, which is a fast decoding architecture. The devices of the decoder/driver stage are connected according to the so-called NAND-type logic. For simplification of the description, a 4-bit row decoding circuit is shown but the principle now described may be applied to any other x-bit row or column decoding circuit, as well as to devices processed by different technologies.

Figure 1B:
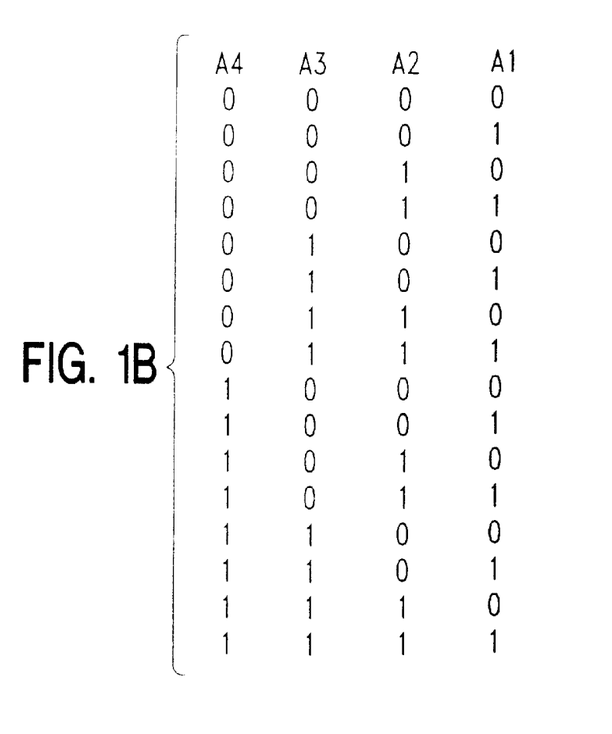
FIG. 1B shows a 4-bit binary code table.

Briefly described, the predecoder stage is composed of 16 blocks, each block having four NFET devices receiving true or complement address bits (A1T/C–A4T/C) being distributed according to a binary code table as the one of FIG. 1B.

A PFET device connected to the output of each predecoder block receives a RESET signal to tie to a high level V+ all the NOR output nodes (OUT1–OUT16) when the circuit is not active i.e., when no decoding operation is required.

Each of the sixteen decoder/driver blocks consists of a 2×ways NAND gate which receives on a first input the corresponding output from the predecoder block and on a second input an asynchronous clock signal CLK. The clock signal gates the final selection of a wordline (one among the sixteen WL1–WL16).

When a cycle for selecting a wordline is initiated, the RESET signal is tied to a high level V+. According to the binary state applied on the gate of the NFET devices of each predecoder block, fifteen outputs predecoder go down to a low voltage while only one output remains high. Then the CLK signal becomes active when the slowest NOR circuit output has been discharged (i.e., the one with only one active NFET device).

Figure 2:
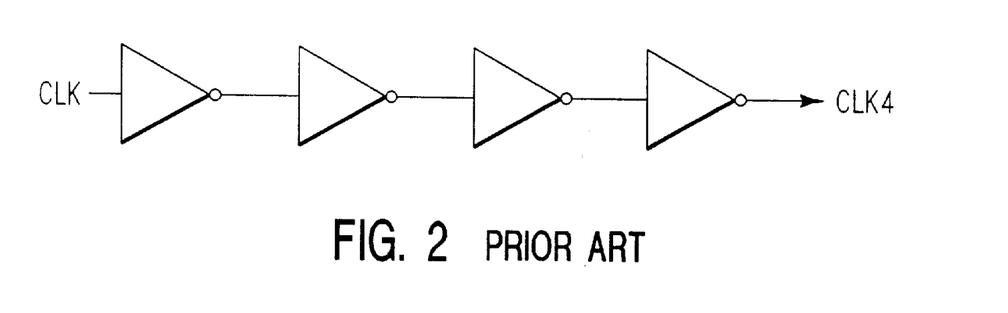
FIG. 2 shows a time margin circuit of the prior art.

Even such a decoding architecture is very fast, it suffers from a risk of a multiselection wordline in case the CL signal becomes valid before the fifteen deselections. And a time margin is added along the path of the CLK signal, such as the circuit of FIG. 2, to delay the gating of the decoder/driver stage. This solution limits the risk of a multi selection, but it does not eliminate it. Unfortunately the gating delay decreases the speed performance of the system.

The drawback of such solution is that the performance of the decoder is both impacted by the longest delay in the predecoder stage moreover the delay of the time margin. Furthermore, it does not give the assurance of preventing a hazard timing from occurring, except if an excessive delay is chosen for the time margin applied to the clock signal, but it does not comply with the nowadays high speed systems.

None of the Cited references, which exemplify the state of the art, teach, claim or even suggest a circuit for avoiding race conditions to be used in connection with decoder systems.

Accordingly, it would be desirable to be able to provide a new and improved decoder which eliminates the aforementioned delay resulting from race condition.

SUMMARY OF THE INVENTION

It is an object of this invention to provide an apparatus for achieving a self-clocked circuit for use in connection with decoder systems.

It is another object of the invention to provide an apparatus for avoiding race condition in memory systems selected in a group comprising various Random Access Memories (RAM) and Read Only Memories (ROM), such as SRAM, DRAM, GRAM, EPROM, . . . .

It is yet another object of the invention to provide improved decoder systems that exhibit operating characteristics that are enhanced by virtue of including the cross-coupled circuit of the invention.

Still further, it is an object of the invention to provide improved methods for enhancing the performance of decoder systems in general.

A self-clocked apparatus for a multi-stage decoder circuit of the type comprising at least a first stage composed of n predecoder blocks and a second stage composed of n decoder/driver blocks, is provided. Each ith predecoder block receives at least a pair of true or complement address bits and outputs a high or low level signal OUTi depending on the address bits state. Each ith decoder/driver block receives at least the signal OUTi from the corresponding predecoder block, and outputs a WLi signal selecting or not selecting a connected line. The self-clocked apparatus of the invention is characterized in that it comprises:

a first gating means connected between the ith predecoder block and the jth decoder/driver block, a second gating means connected between the jth predecoder block and the ith decoder/driver block, the first means inputting said ith signal OUTi and outputting a ith gating signal GTi, the ith gating signal GTi being applied on said jth decoder/driver block for gating said jth signal OUTj, and the second means inputting said jth signal OUTj and outputting a jth gating signal GTj, the jth gating signal GTj being applied on said ith decoder/driver block for gating said ith signal OUTi.

In a preferred embodiment, the self-clocked apparatus is implemented in a decoder comprising predecoder blocks of a NOR-type logic circuitry, and decoder/driver blocks of a NAND-type logic circuitry.

The NAND-type logic circuitry may comprise a 3×Ways NAND gate receiving:

on a first input, a true or complement address bit, on a second input, the output of the corresponding predecoder block, and on a third input, the output of a gating means cross-connected to a predecoder block, and wherein the gating means inverts the phase of the third input.

In another embodiment, the gating means are connected between two predecoder/driver blocks receiving consecutive binary addresses, according to a binary code.

In yet another embodiment, the self-clocked apparatus of the invention is used for either a word decoder or a bit decoder.

BRIEF DESCRIPTION OF THE DRAWINGS

The present invention is illustrated by way of example and not limited in the figures of the accompanying drawings in which like references indicate similar elements; and in which.

DETAILED DESCRIPTION OF THE INVENTION

Figure 3:
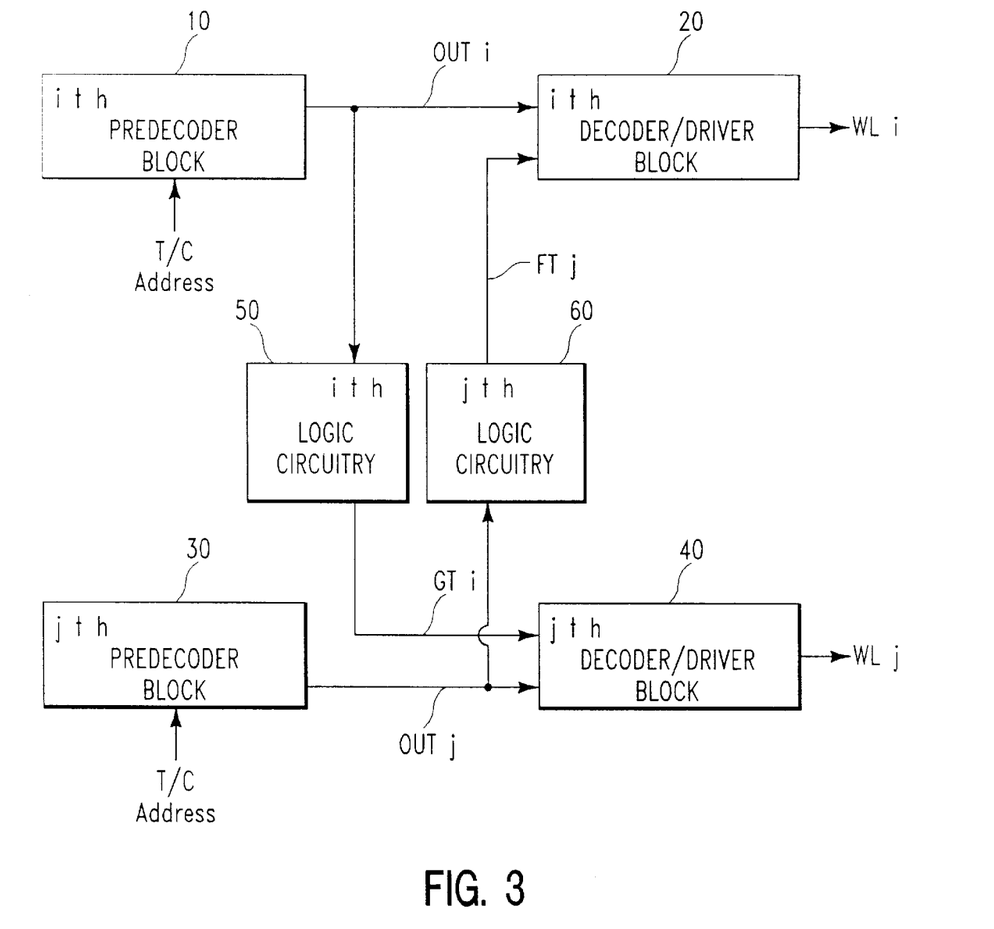
FIG. 3 is a block diagram of the cross-connected circuit of the invention.

Referring now to FIG. 3 showing a block diagram of the circuit of the invention used in a word decoder, the principle is described hereinafter for a pair of ith and jth blocks.

A ith predecoder block (10) receives true/complement address bits, and outputs a predecoding output signal OUTi.

The output OUTi of predecoder block (10) is input to a corresponding ith decoder/driver block (20), which outputs a wordline signal WLi.

A jth predecoder block (30) receives true/complement address bits, and outputs a predecoding output signal OUTj.

The output OUTj of predecoder block (30) is input to a corresponding jth decoder/driver block (40), which outputs a wordline signal WLj.

The ith decoder/driver block (20) also inputs a signal GTj provided from a jth logic circuitry (60) which inputs the output signal OUTj of the jth predecoder block (30).

The jth decoder/driver block (40) also inputs a signal GTi provided from a ith logic circuitry (50) which inputs the output signal OUTi of the ith predecoder block (10).

The self-clocked logic circuitry (50,60) is cross-connected between the ith and jth blocks such that the ith decoder/driver block is controlled by the jth predecoder block to ultimately select a wordline.

For the purpose of the description, it is assumed that the decoder is composed of a predecoder stage with circuit blocks of a NOR-type and a decoder/driver stage with circuit blocks of a NAND-type (as the decoder shown in FIG. 1A). This assumption is just for illustration and the person skilled in the art will recognize that with some adaptations, the invention may be used with other logic-type decoders.

Figure 4:
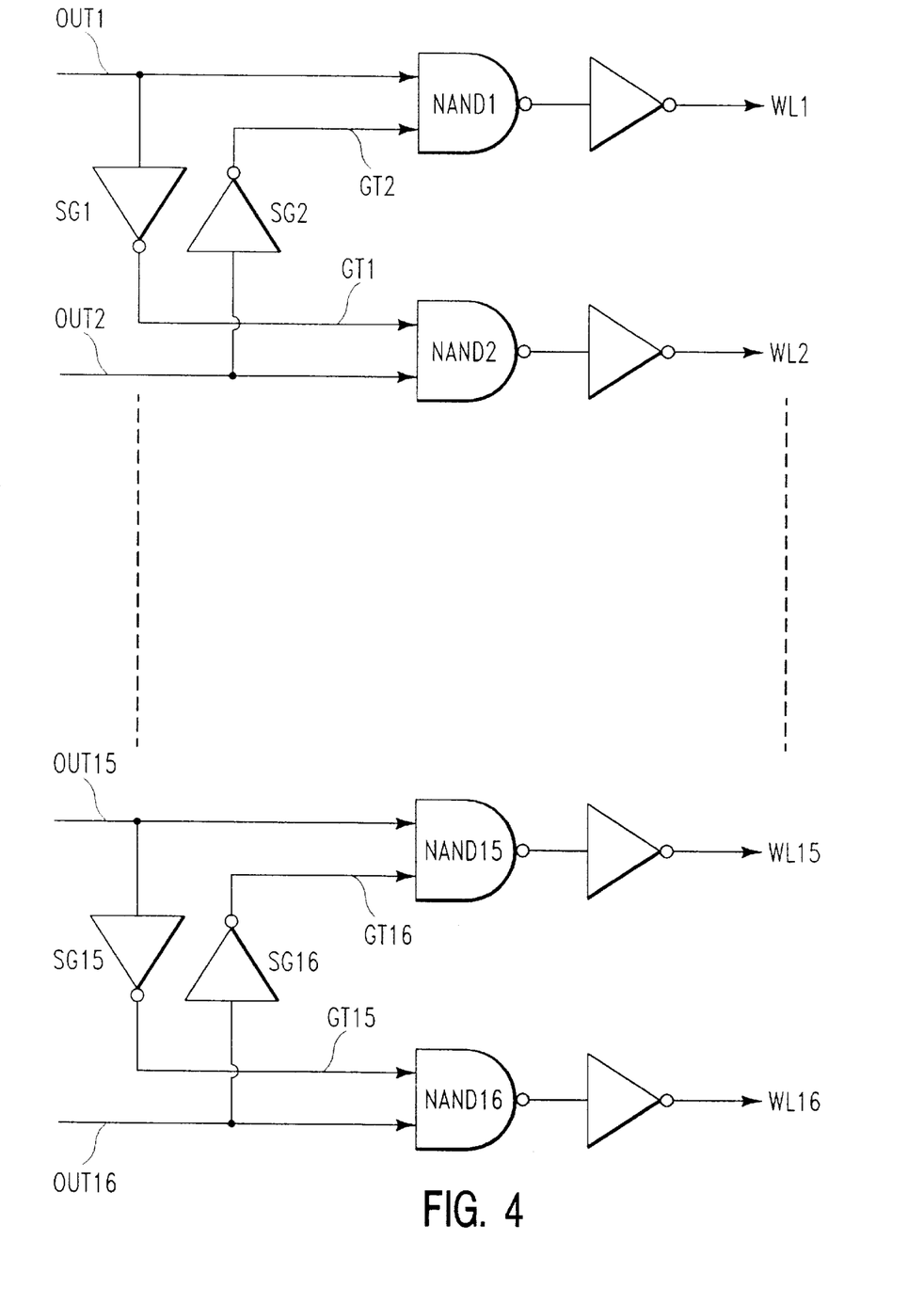
FIG. 4 is a circuit diagram of the circuit of the invention in a preferred embodiment.

FIG. 4 illustrates an embodiment of the circuit of the present invention, for the two top NOR-type predecoder blocks (not shown) outputting signals OUT1, OUT2 with corresponding NAND-type decoder/driver blocks outputting wordline signals WL1, WL2.

FIG. 4 also shows the circuit of the present invention connected between the two bottom NOR-type predecoder blocks (not shown) outputting signals OUT15, OUT16 with corresponding NAND-type decoder/driver blocks outputting wordline signals WL15, WL16.

Between these top and bottom pairs of blocks, the circuit of the invention is regularly connected between two blocks, and the same cross-connection is similarly repeated for all the decoder circuit.

In a preferred embodiment, the cross-connection is made between two adjacent predecoder blocks, but it can be made between non adjacent blocks without departing from the spirit of the invention.

Output OUT1 as discussed above is connected to one input of a 2×Ways NAND gate NAND1 of a first decoder/driver block, while output OUT2 is connected to one input of a 2×Ways NAND gate NAND2 of a second decoder/driver block.

Outputs (OUT1, OUT2) are respectively also inputs to logic circuitry which in a preferred embodiment are the inverters SG1 and SG2. The inverted output GT1 of inverted SG1 is connected to the second input of the 2×Ways NAND2, while the inverted output GT2 of inverter SG2 is connected to the second input of the 2×Ways NAND1.

As previously discussed, when no selection of wordline is required, i.e., when the memory is not addressed, all the outputs OUT1–OUT16 are tied to a high level, corresponding to a 0.1" logical value on a first input of NAND1 and NAND2.

Inverters SG1 and SG2 invert the data so that inputs "1" from outputs OUT1 and OUT2 are output as a "0" logical value. The output "0" of inverter SG1 is the second input of NAND2, and the output "0" of inverter SG2 is the second input of NAND1, respectively. Therefore each gate NAND1 and NAND2 detects a (1,0) binary state, which is a binary condition to tie to a low level the wordline signals WL1 and WL2. In the same manner, all the NAND gates detect a (1,0) binary state, then all the wordline signals WLi are tied to allow level, and no wordline is selected. Now in the operating mode, when the memory is addressed, true/ complement address bits are pulsed either to a high or low level ("1" or "0" logical value), depending on the value of the address to be selected. Then outputs of predecoder blocks receiving a binary state comprising at least a logical "1" discharges through the active devices (not shown but identical to FIG. 1A). The output of the sole predecoder block receiving a binary state composed only of "0" remains high.

It is assumed that according to FIG. 4, OUTi remains high while OUT2 discharge. The output of inverter SG1 remains unchanged, i.e., a logical "0", while the output of inverter SG2 goes up to a high level.

Therefore the binary state on the input of NAND1 becomes a (1,1) which is the only case for the wordline signal WL1 to charge to a high level, and then to select the corresponding memory cell in the memory array.

The binary state on the input of NAND2 changes from (1,0) to (0,0) due to the discharge of output OUT2. As a binary state (0,0) is an equivalent state for a NAND logical gate than a binary state (1,0), the final output does not change, and thus the wordline signal WL2 remains low.

Because one input of 2×Ways NAND2 remains low (GT1 from the output of inverter SG1), there is no risk for the final output of NAND2 to be selected. In fact, the discharge of OUT2 is a confirmation of the unselection of WL2.

While the above operation has been described for a pair of decoder blocks comprising the selected wordline, a similar operation is now described for one of any of the other pairs of decoder blocks, comprising two unselected wordlines.

As shown on FIG. 4, the bottom pair of blocks comprises two wordline signals (WL15, WL16). The outputs (OUT15, OUT16) of predecoder blocks are such that when the memory is addressed, both outputs discharge through the active devices (devices receiving a logical "1" on their gate input, as shown on FIG. 1A).

Then the inverted outputs of inverters SG15 and SG16 go up to a high level, respectively. Therefore the binary state on the input of gate NAND15 as well as gate NAND16 changes from (1,0) to (0,1).

While a steady state (0,1) is equivalent of a steady state (1,0) for a logical 2×Ways NAND gate (i.e., logical "0" on the output), the transition phase from one state to the other may involve a risk of detecting a (1,1) logical state during a short time, and then modifying the NAND gate output.

This situation could occur with an implementation of the circuit of the invention, only if the output of one predecoder block discharges slowly while the output of the cross-connected predecoder block discharges rapidly. Such a case is possible if the cross-connection of the self-clocked circuit is made between predecoder blocks receiving true/ complement address bits such that the number of active devices in one predecoder block is very different than the number of active devices of the other predecoder block, during an operation of selection. The worst case is when the number of active devices in one predecoder block is twice the number of active devices in the cross-connected predecoder block.

Therefore, in a preferred embodiment, the circuit of the invention is cross-connected between predecoder blocks receiving consecutive binary addresses. Then the number of active devices in each predecoder block differs only by one, and the discharging time for both blocks is about the same, eliminating thus the risk of multi selection.

Furthermore, in order to improve the efficiency of the circuit of the invention, the devices implemented in the logic circuitry are well dimensioned thereby reducing the risk of a multi selection.

Figure 5A:
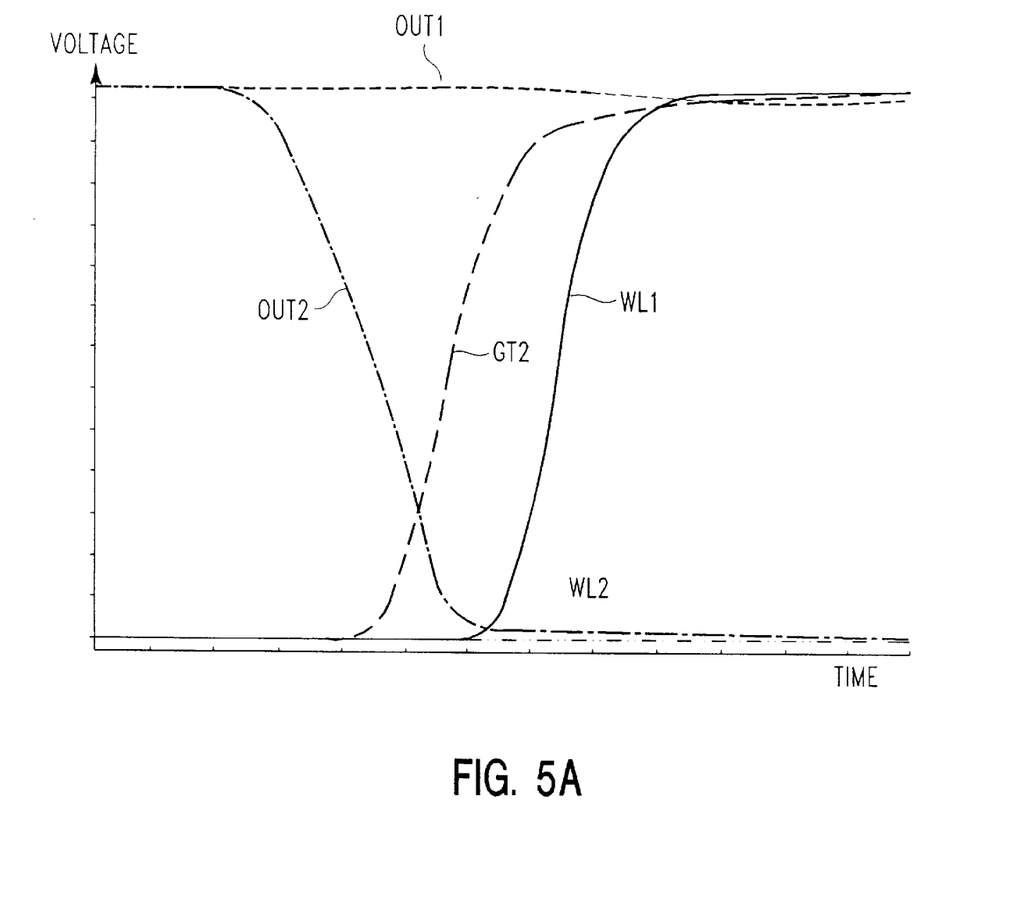
FIG. 5A and FIG. 5B are timing diagrams of a word decoder employing the self-clocked circuit of the present invention.
Figure 5B:
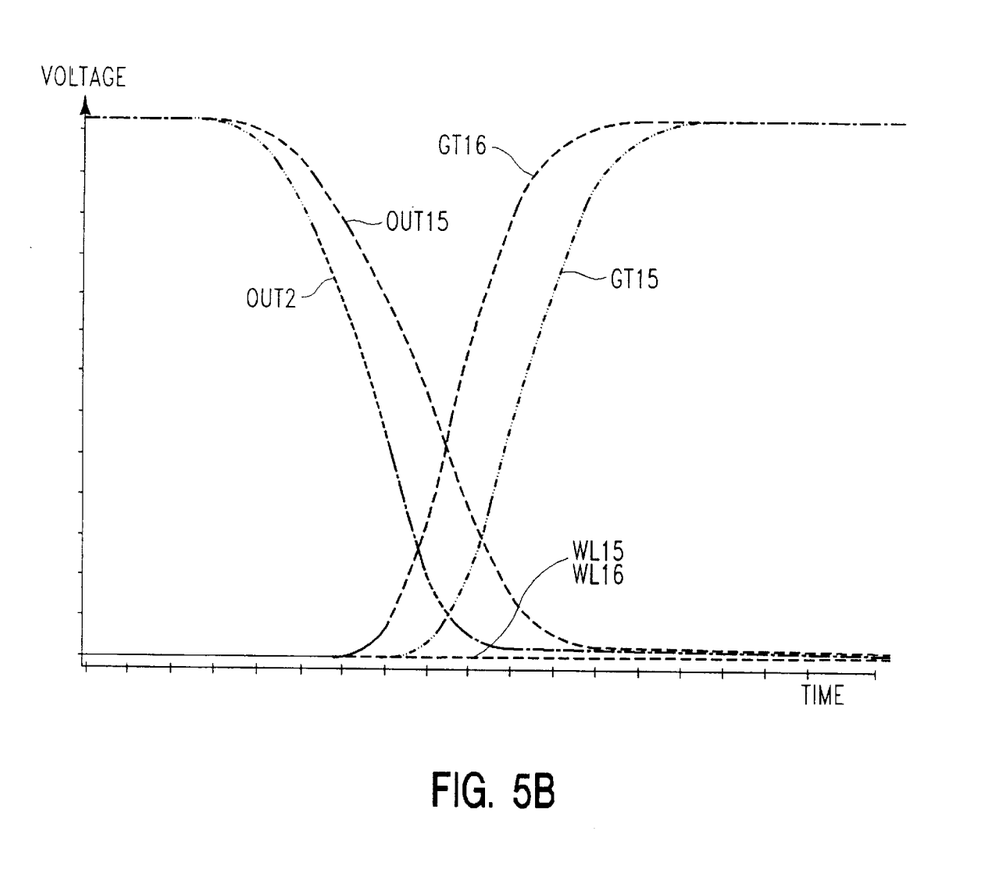

FIG. 5A and FIG. 5B are timing diagrams illustrating various outputs of a decoder for a cross-connection of the self-clocked circuit of the invention, made between adjacent predecoder blocks.

As a result of the aforementioned embodiment, the advantage of the invention is that the internal timing of the ith decoder/driver block is controlled by the i+1th predecoder block, and conversely. Then, an external clock signal can be removed, and the time margins used in the prior art decoder design can also be removed. Furthermore, as the cross-connected blocks are adjacent they closely track together and therefore the invention provides a robust electrical design.

Figure 6:
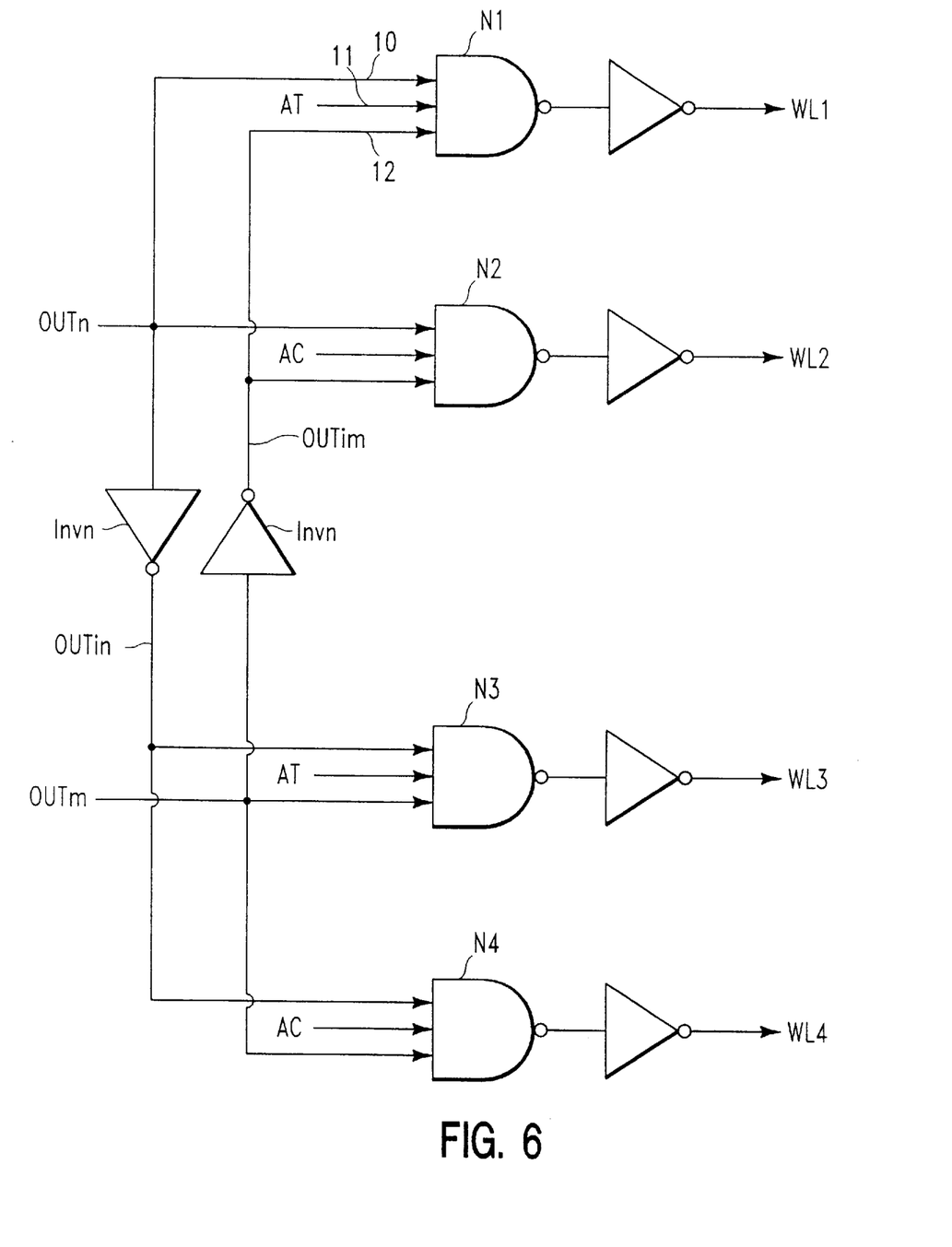
FIG. 6 is another implementation of the circuit of the invention, wherein a 3×ways NAND is used.

FIG. 6 is another embodiment of the invention, based on the use of a known high speed decoder wherein the decoder comprises a first predecoder stage and a second decoder/ driver stage in which each decoder/driver block is composed of two sub-decoder/driver blocks connected to a common predecoder block. Each sub-decoder/driver block comprises a 3×Ways NAND gate, each one receiving:

on a first input (10) the output OUTn of the common predecoder block, on a second input (11) a true or complement (AT, AC) address bit, and on a third input (12) the output OUTim of a self-clocked circuit cross-connected with a second predecoder block.

In such implementation, two cross-connected circuits of the invention are used to control the risk of multi selection four wordlines by four. The invention is able to reduce the access time of a SRAM by about 700 ps to 800 ps.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A self-clocked apparatus for a multi-stage decoder circuit of the type having at least a first stage composed of n predecoder blocks and a second stage composed of n decoder/driver block, each ith predecoder block (10) receiving at least a pair of true or complement address bits and outputting a high or low level OUTi signal from the corresponding predecoder block (10), and outputting a Wli signal selecting or not selecting a connected line comprising:

a first gate means (50) exclusively connected between the ith predecoder block (10) and the jth decoder/driver block (40);

a second gating means (60) connected between the jth predecoder block (30) and the ith decoder/driver block (20);

the first gating means inputting said ith OUTi signal and outputting a ith GTi gating signal, the ith GTi gating signal being applied on said jtb decoder/driver block for gating a jth OUTj signal; and the second gating means inputting said jth OUTj signal and outputting a jth GTj gating signal, the jth GTj gating signal being applied on said ith decoder/driver block for gating said ith OUTi signal.

2. A self-clocked apparatus for a multi-stage decoder circuit of the type having at least a first stage composed of n predecoder blocks and a second stage composed of n decoder/driver blocks, each ith predecoder block (10) receiving at least a pair of true or complement address bits and outputting a high or low level OUTi signal depending on the address bits state, each ith decoder/driver block (20) receiving at least the OUTi signal from the corresponding predecoder block (10), and outputting a Wli signal selecting or not selecting a connected line comprising:

a first gating means (50) exclusively connected between the ith predecoder block (10) and the ith decoder/driver black (40);

a second gating means (60) connected between the jth predecoder block (30) in a NOR-type logic circuitry and the ith decoder/driver block (20) in a NAND-type logic circuitry having two 3×Ways NAND gates (N1, N2) receiving respectively a true or complement address bit (AT, AC), the output of the corresponding predecoder block (OUTn) and the output OUTim of the gating means (INVm) from the cross-connected predecoder block wherein the output (GTi, GTj) of said gating means (50, 60) is the inverted phase of the output signals (OUTi, OUTj) of corresponding predecoder blocks (10, 30).

3. A self-clocked apparatus for a multi-stage decoder circuit of the type having at least a first stage composed of n predecoder blocks and a second stage composed of n decoder/driver blocks, each ith predecoder block(10) receiving at least a pair of true or complement address bits and outputting a high, or low level OUTi signal depending on the address bits state, each ith decoder/driver block (20) receiving at least the OUTi signal from the corresponding predecoder block (10), and outputting a Wli signal selecting or not selecting a connected line comprising:

a first gating means (50) exclusively connected between the ith predecoder block (10) and the ith decoder/driver block (40);

a second gating means (60) connected between the ith predecoder block (30 in a NOR-type logic circuitry and the ith decoder/driver block (20) in a NAND-type logic circuitry having two 3×Ways NAND gates (N1, N2) receiving respectively a true or complement address bit (AT, AC), the output of the corresponding predecoder block (OUTn) and the output OUTim of the gating means (INVm) from the cross-connected predecoder block said first and second gating means (50, 60) are connected between adjacent predecoder and decoder/driver blocks receiving consecutive binary addresses, wherein the output (GTi, GTj) of said gating means (50, 60) is the inverted phase of the output signals (OUTi, OUTj) of corresponding predecoder blocks (10, 30).

4. The self-clocked apparatus of claim 3 wherein said decoder is a wordline decoder.

5. The self-clocked apparatus of claim 3 wherein said decoder is a bitline decoder.

6. The self-clocked apparatus of claim 5 wherein said multi-stage decoder is used in a memory system selected in a group consisting of SRAM, DRAM, GRAM, ROM, EPROM.

* * * * *